United States Patent
Wu et al.

(10) Patent No.: US 8,468,888 B2
(45) Date of Patent: Jun. 25, 2013

(54) MEMS SENSOR CAPABLE OF SENSING ACCELERATION AND PRESSURE

(75) Inventors: Ming-Ching Wu, Taipei County (TW); Chih-Kung Huang, Taipei County (TW); Jeff Biar, Taipei County (TW); Kazuhiro Okada, Ageo (JP)

(73) Assignees: Domintech Co., Ltd., Taipei County (TW); Okada Kuzuhiro, Saitama (JP)

( * ) Notice: Subject to any disclaimer, the term of this patent is extended or adjusted under 35 U.S.C. 154(b) by 309 days.

(21) Appl. No.: 12/951,738

(22) Filed: Nov. 22, 2010

(65) Prior Publication Data

US 2012/0060605 A1    Mar. 15, 2012

(30) Foreign Application Priority Data

Sep. 9, 2010  (TW) .............................. 99130544 A

(51) Int. Cl.
*G01P 15/12*  (2006.01)
*G01P 15/125*  (2006.01)
*G01L 7/08*  (2006.01)

(52) U.S. Cl.
USPC ..................... 73/514.32; 73/514.33; 73/714

(58) Field of Classification Search
USPC ................... 73/514.32, 514.33, 714
See application file for complete search history.

(56) References Cited

U.S. PATENT DOCUMENTS

| | | | |
|---|---|---|---|
| 4,905,523 A | 3/1990 | Okada | |
| 6,662,659 B2 * | 12/2003 | Saitoh | 73/514.34 |
| 7,322,241 B2 * | 1/2008 | Kai | 73/514.33 |
| 7,647,832 B2 * | 1/2010 | Muchow et al. | 73/514.33 |

* cited by examiner

*Primary Examiner* — John Chapman, Jr.
(74) *Attorney, Agent, or Firm* — Muncy, Geissler, Olds & Lowe, PLLC

(57) ABSTRACT

A MEMS sensor capable of sensing acceleration and pressure includes a frame, a proof mass and flexible bridges connected between the frame and the proof mass in such a way that the proof mass is moveably suspended inside the frame. The proof mass is provided with a pressure sensing diaphragm and a sealed chamber corresponding to the diaphragm such that the proof mass is not only served as a moveable sensing element for acceleration measurement but also a pressure sensing element.

14 Claims, 13 Drawing Sheets

MEMS SENSOR CAPABLE OF SENSING ACCELERATION AND PRESSURE

BACKGROUND OF THE INVENTION

1. Field of the Invention

The present invention relates generally to a micro-electromechanical system (hereinafter referred to as "MEMS") sensor having a moveable sensing element and more particularly, to a multifunctional MEMS sensor capable of sensing acceleration and pressure simultaneously.

2. Description of the Related Art

MEMS sensors, including but not limited to inertia sensors, such as accelerometers and gyroscopes, pressure sensors and gas sensors, are intensively used in many fields, such as cars, computers, consumer electronic devices, communication devices and etc. Many MEMS sensors include one or more moveable sensing elements, which are so-called "proof masses." For example, U.S. Pat. No. 4,905,523 disclosed a force detector and a moment detector. By means of detecting the value changes of the resistances representing the stress-strain variation caused by movement of the proof mass, the change of the external force can be indirectly detected.

In some electronic products, two or more sensors may be used. For example, a pressure sensor and an accelerometer may be equipped inside a laptop for sensing the ambient pressure and the posture of the laptop simultaneously. However, a certain space will be occupied for the installation of the two individual sensors in an electronic product. In other words, the aforesaid nowadays design can not fulfill the market demand for small, thin and light electronic product. In addition, using two individual sensors also increases the costs of the electronic product.

SUMMARY OF THE INVENTION

The present invention has been accomplished in view of the above-noted circumstances. It is therefore an object of the present invention to provide a MEMS sensor, which is capable of sensing acceleration and pressure simultaneously.

It is another object of the present invention to provide a MEMS sensor capable of sensing acceleration and pressure, which combines integrally a moveable sensing element for acceleration measurement and a pressure sensing element as a unit having a small size.

To attain the above-mentioned objects, the MEMS sensor provided by the present invention comprises a frame, a proof mass and flexible bridges connected between the frame and the proof mass in such a way that the proof mass is suspended inside the frame. In addition, the proof mass has a pressure sensing diaphragm and a sealed chamber beneath the pressure sensing diaphragm. By means of the sealed chamber and the pressure sensing diaphragm provided in the proof mass, the proof mass can be served as a pressure sensing element as well as a moveable sensing element for acceleration measurement. In addition, the acceleration and pressure sensing functions are integrated in a single sensor, dramatically minimize its size compared to the prior art that needs to adopt two individual sensors.

In a preferred embodiment of the present invention, the MEMS sensor has a two-layered construction comprising a bottom layer and a top layer bonded on the bottom layer. The top layer comprises the flexible bridges and a center portion that is connected with the flexible bridges and provided with the pressure sensing diaphragm. The bottom layer comprises a center portion corresponding to the center portion of the top layer such that the center portions of the top and bottom layers form the proof mass and the sealed chamber is formed between the pressure sensing diaphragm of the center portion of the top layer and the center portion of the bottom layer.

In a preferred embodiment of the present invention, the MEMS sensor is realized as a three-axis accelerometer comprising a first pair of bridges linearly arranged on two opposite sides of the proof mass, and a second pair of bridges linearly arranged on another two opposite sides of the proof mass and extending along a direction that is orthogonal to a direction along which the first pair of bridges extend.

The above-mentioned MEMS sensor can be a piezo-resistive type or a capacity type. For a piezo-resistive type MEMS sensor, a plurality of resistances for measuring acceleration are arranged on the flexible bridges and a plurality of resistances for measuring pressure are arranged on the pressure sensing diaphragm.

Preferably, the resistances for measuring acceleration comprises a first set of four resistances arranged on the first pair of bridges, and a second set of four resistances and a third set of four resistances arranged on the second pair of bridges. The resistance for measuring pressure comprises a set of four resistances arranged on the pressure sensing diaphragm.

For a capacity type MEMS sensor, the top layer is further provided with an ambient portion connected around the center portion thereof. A plurality of capacity electrodes for measuring acceleration are arranged on the center and ambient portions of the top layer, and a capacity electrode for measuring pressure are arranged on the pressure sensing diaphragm. In addition, the MEMS sensor further comprises a cap bonded on the top layer and provided with a ground electrode facing the capacity electrodes for measuring acceleration and pressure.

In a preferred embodiment of the present invention, the thickness of the bridges is equal to the thickness of the pressure sensing diaphragm, such that the bridges and the pressure sensing diaphragm have a same sensitivity of deformation. However, the thicknesses of the bridges and the pressure sensing diaphragm can be different, i.e. the thickness of the bridges may be greater or less than that of the diaphragm subject to the practical need, such that the bridges can have a sensitivity different from that of the diaphragm.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given herein below and the accompanying drawings which are given by way of illustration only, and thus are not limitative of the present invention, and wherein.

DETAILED DESCRIPTION OF THE INVENTION

It is to be firstly mentioned that the same numeral references used in the following paragraphs and the appendix drawings refer to the same or similar elements and/or structural features.

Figure 1:
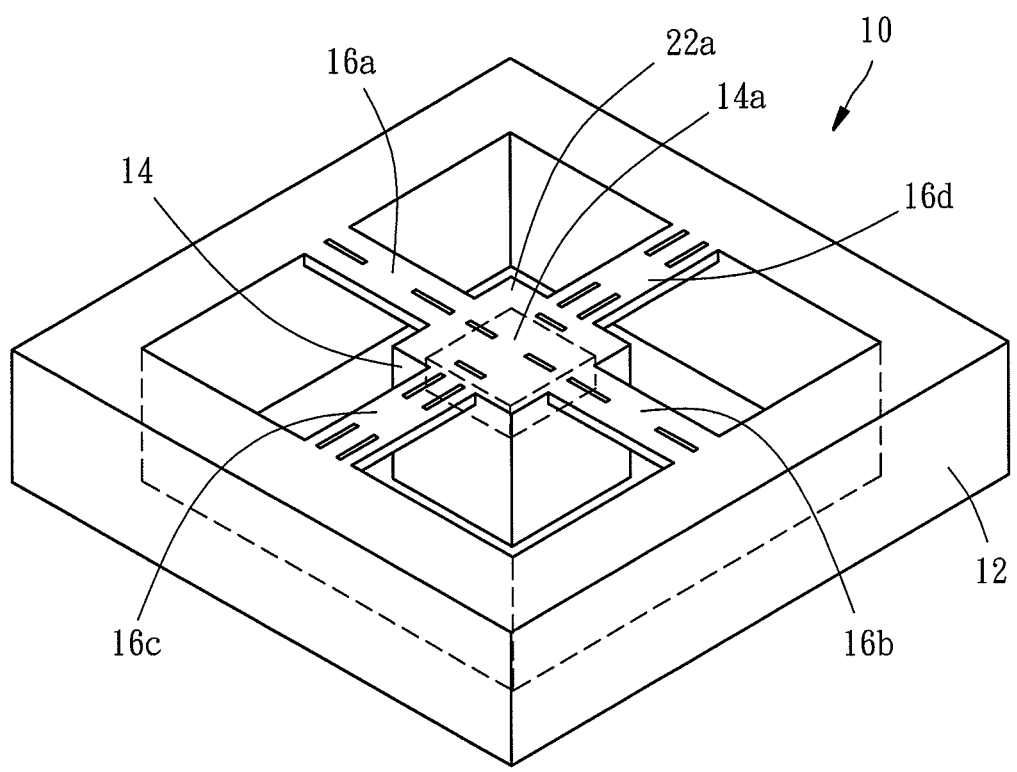
FIG. 1 is a schematic perspective view of a MEMS sensor according to a first preferred embodiment.
Figure 2:
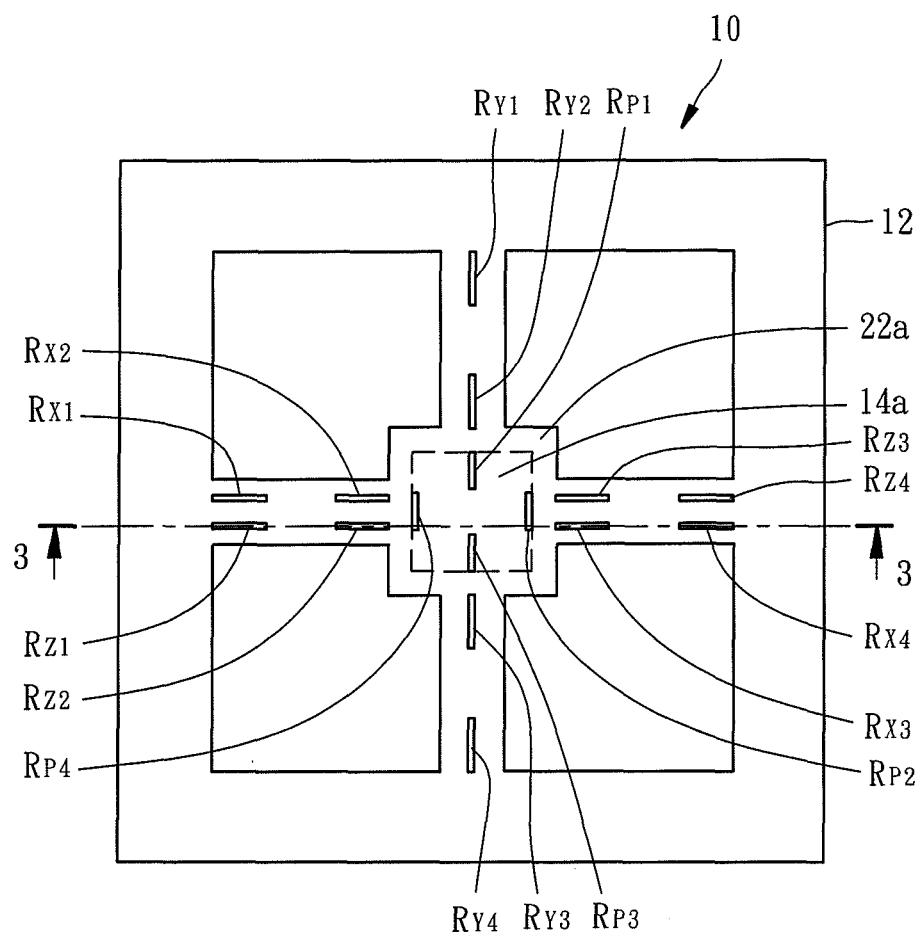
FIG. 2 is a top view of FIG. 1.
Figure 3:
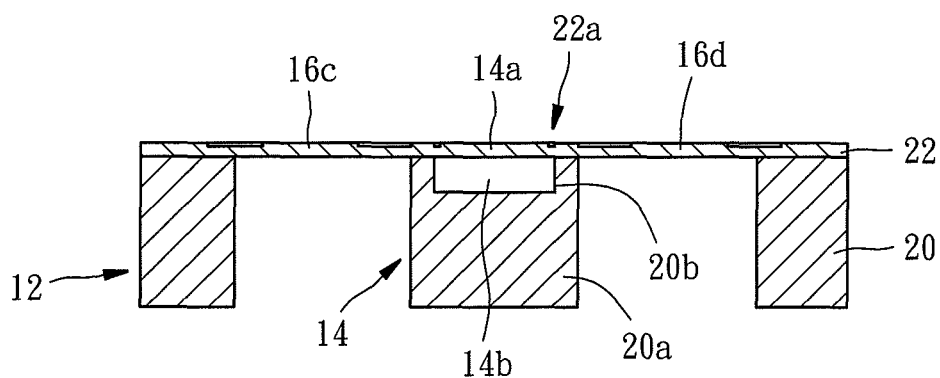
FIG. 3 is a sectional view taken along line 3-3 of FIG. 2.

Referring to FIGS. 1-3, a MEMS sensor, denoted by numeral reference 10 and provided according to a first preferred embodiment of the present invention, is realized as a piezo-resistive type MEMS sensor capable of sensing three-axis acceleration and an absolute pressure. However, it will be appreciated that the technical feature of the present invention can be applied on various MEMS sensors containing a moveable sensing element, including but not limited to the aforesaid one.

As shown in FIGS. 1-3, the MEMS sensor 10 comprises mainly a frame 12, a proof mass 14 and four flexible bridges 16a to 16d integrally connected between the frame 12 and the proof mass 14 in such a way that the proof mass 14 is suspended inside the frame 12. In addition, the proof mass 14 is provided with a pressure sensing diaphragm 14a at a top surface thereof, and a sealed chamber 14b beneath the pressure sensing diaphragm 14a.

Specifically speaking, in this preferred embodiment the MEMS sensor 10 is a two-layered construction including a bottom layer 20 and a top layer 22 bonded on the bottom layer 20. Four sides of the bottom and top layers 20 and 22 form the hollow rectangular frame 12 of the MEMS sensor 10. As to the method of manufacturing the MEMS sensor, it will be described in the following paragraphs.

The top layer 22 has the aforesaid flexible bridges 16a to 16d and a rectangular center portion 22a on which the rectangular pressure sensing diaphragm 14a is defined. The four flexible bridges 16a to 16d each have an end integrally connected with a middle of one of four sides of the frame of the top layer 22, and the other end integrally connected with a middle of one of the four sides of the center portion 22a of the top layer 22. More specifically speaking, the four flexible bridges 16a to 16d can be divided into a first pair of bridges 16a and 16b, and a second pair of bridges 16c and 16d. The first pair of bridges 16a and 16b are linearly arranged on two opposite sides of the center portion 22a of the top layer 22, and the second pair of bridges 16c and 16d are linearly arranged on the other two opposite sides of the center portion 22a of the top layer 22 in such a way that the direction along which the first pair of bridges 16a and 16b extend is orthogonal to the direction along which the second pair of bridges 16c and 16d extend.

On the other hand, the bottom layer 20 further comprises a center portion 20a corresponding in configuration to the center portion 22a of the top layer 22, such that the center portion 22a of the top layer 22 and the center portion 20a of the bottom layer 20 together form the above-mentioned proof mass 14. In addition, the center portion 20a of the bottom layer 20 is provided with a recess 20b, such that the above-mentioned sealed chamber 14b can be formed in between the pressure sensing diaphragm 14a of the center portion 22a of the top layer 22 and the center portion 20a of the bottom layer 20.

The mechanical construction of the MEMS sensor 10 has been detailedly described in the foregoing paragraphs, and the electronic part of the MEMS sensor 10 for enabling three-axis acceleration and pressure measurement will be recited hereunder.

A plurality of piezoresistances that can form three Wheatstone bridges for measuring accelerations in X-axis, Y-axis and Z-axis directions are implanted on the top surfaces of the flexible bridges 16a to 16d, and a plurality of piezoresistances that can form a Wheatstone bridge for measuring pressure are implanted on the top surface of the pressure sensing diaphragm 14a. Specifically speaking, a first set of four resistances $R_{Y1}$ to $R_{Y4}$ are arranged on the first pair of bridges 16a and 16b, a second set of four resistances $R_{X1}$ to $R_{X4}$ and a third set of four resistances $R_{Z1}$ to $R_{Z4}$ are arranged on the second pair of bridges 16c and 16d, and a set of four resistances $R_{P1}$ to $R_{P4}$ are arranged on the pressure sensing diaphragm 14a. Since the structure and operation principle of the accelerometer of this kind are well-known to a person skilled in the arts including but not limited to U.S. Pat. No. 4,905,523 and using piezoresistances to measure pressure is also a well-known prior art, a detailed description thereof needs not to be recited hereinafter.

As indicated above, thanks to the cooperation of the frame, flexible bridges, proof mass and the acceleration measuring resistances the MEMS sensor 10 can be served as an accelerometer, and in addition, the MEMS sensor can also be served as a pressure sensor thanks to the pressure sensing diaphragm, the sealed chamber and the pressure measuring resistances provided in the proof mass. Further, since the pressure sensing elements are integrated with the proof mass which is the moveable sensing element provided in a conventional accelerometer, the MEMS sensor that is capable of sensing acceleration and pressure and provided by the present invention can have a small size equal to the size of the conventional accelerometer.

The method of making the MEMS sensor according to the first preferred embodiment of the present invention will be outlined hereinafter with the appendix drawings.

Figure 4A:
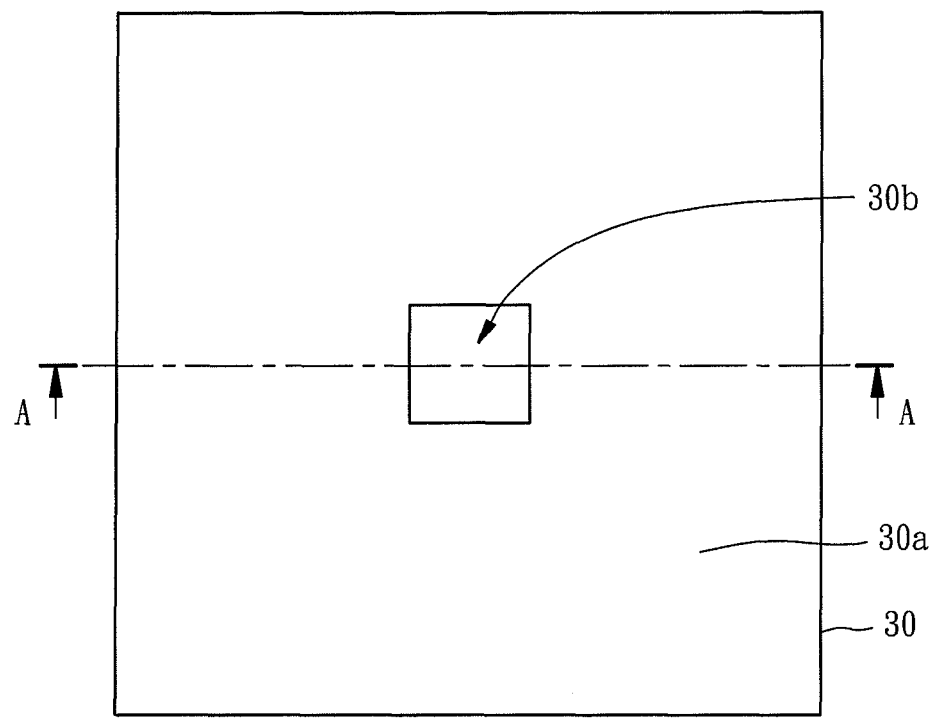
FIG. 4A is a schematic top view showing a manufacturing step of the MEMS sensor of the first preferred embodiment of the present invention, in which a recess is formed on a top surface of a first wafer.
Figure 4B:
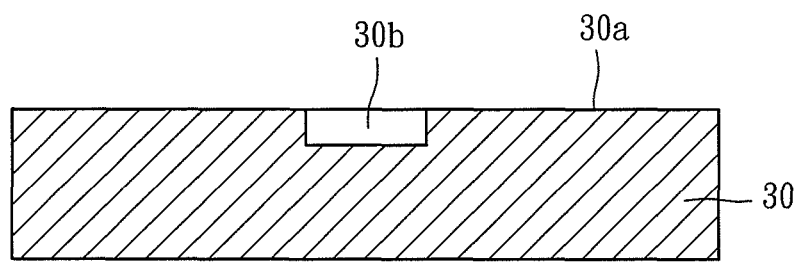
FIG. 4B is a sectional view taken along line A-A of FIG. 4A.

Referring to FIGS. 4A and 4B, the first step is to form a recess 30b on the top surface 30a of a silicon wafer 30 (hereinafter referred to as "the first wafer") by etching. The first wafer 30 may have a thickness of about 400 μm, and the recess 30b may have an area of about 500 μm by 500 μm, and a depth of about 10-50 μm.

Figure 5:
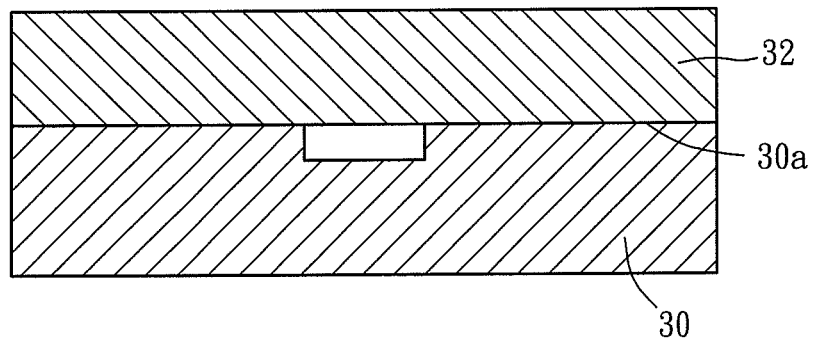
FIG. 5 is a schematic sectional view showing that a second wafer is bonded on the top surface of the first wafer.
Figure 6:
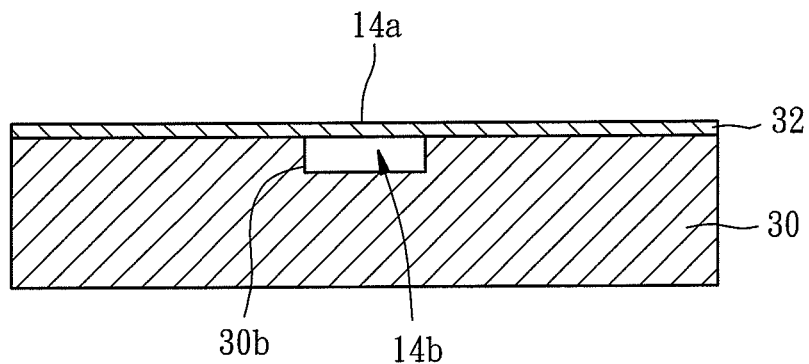
FIG. 6 is a schematic sectional view showing that the second wafer has been thinned.

Next, as shown in FIG. 5, an n-type Si wafer 32 (hereinafter referred to as "the second wafer") is bonded on the top surface 30a of the first wafer 30. For the way of bonding the two wafers, a fusion bonding or other appropriate way can be used.

After the first wafer 30 and the second wafer 32 are bonded together, the second wafer 32 is thinned to about 5-10 μm, such that the portion of the second wafer 32, which corresponds in location and shape to the recess 30b, becomes the pressure sensing diaphragm 14a, and the sealed chamber 14b is formed in between the pressure sensing diaphragm 14a and the recess 30b. It is to be understood that the crosssection of the sealed chamber 14b, i.e. the shape of the diaphragm 14a, is not limited to square. Circle or other appropriate shape can be used. In addition, any suitable thinning technology, including but not limited to mechanical grinding, chemical-mechanical polishing and wet chemical etching, can be used to thin the second wafer 32.

Figure 7A:
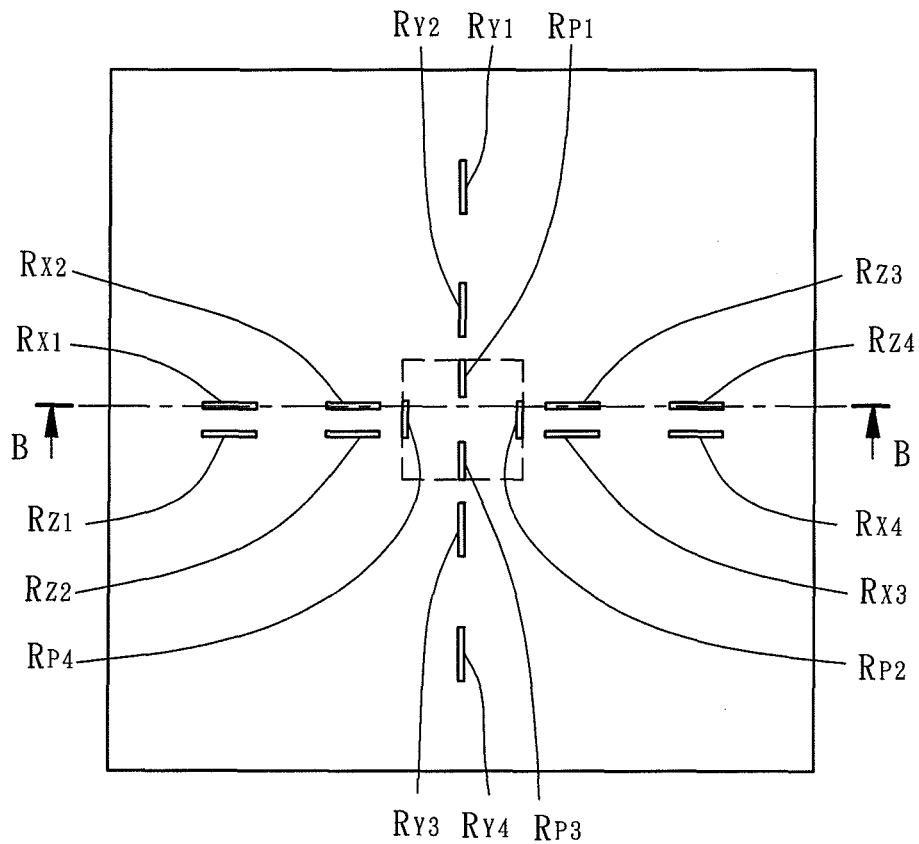
FIG. 7A is a schematic top view showing that resistances for measuring acceleration and pressure are implanted on the top surface of the thinned second wafer.
Figure 7B:
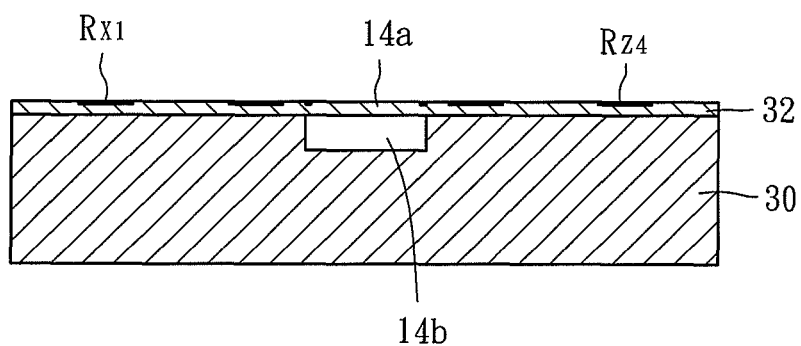
FIG. 7B is a sectional view taken along line B-B of FIG. 7A.

FIGS. 7A and 7B show that resistances $R_{X1}$ to $R_{X4}$, $R_{Y1}$ to $R_{Y4}$, $R_{Z1}$ to $R_{Z4}$ and $R_{P1}$ to $R_{P4}$ are implanted on predetermined locations of the second wafer 32. The detailed description about the way of forming the resistances can be found in U.S. Pat. No. 4,905,523.

Figure 8A:
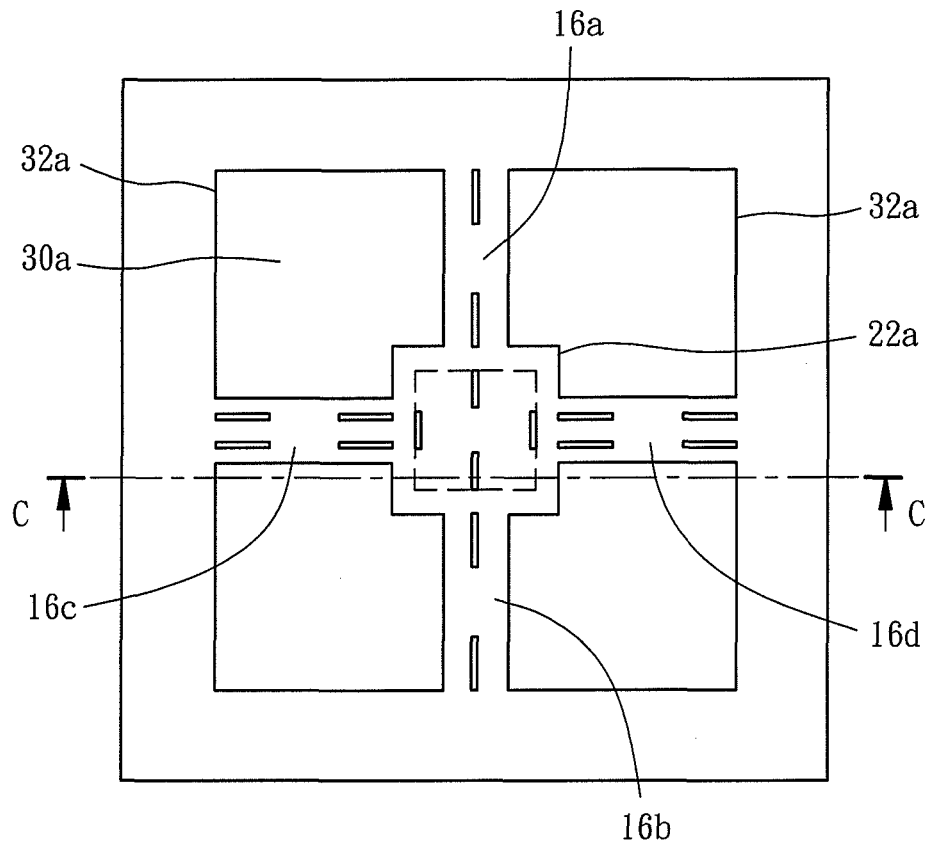
FIG. 8A is a schematic top view showing that four openings are formed around a center portion of the second wafer.
Figure 8B:
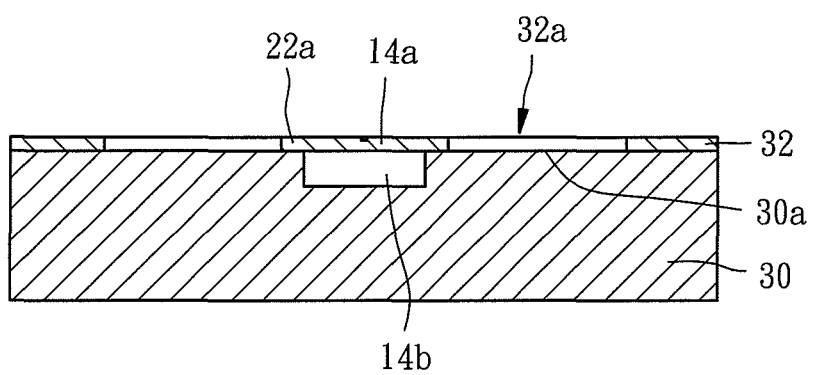
FIG. 8B is a sectional view taken along line C-C of FIG. 8A.

The next step in the process is to form four openings 32a on the second wafer 32 by etching, as shown in FIGS. 8A and 8B. These openings 32a are equiangularly spaced around the centre portion of the second wafer 32. In addition, these openings 32a penetrate through the top and bottom surfaces of the second wafer 32 and have a predetermined configuration in such a way that four bridges 16a to 16d and a center portion 22a integrally connected with the bridges 16a to 16d are formed on the second wafer 32.

Figure 9A:
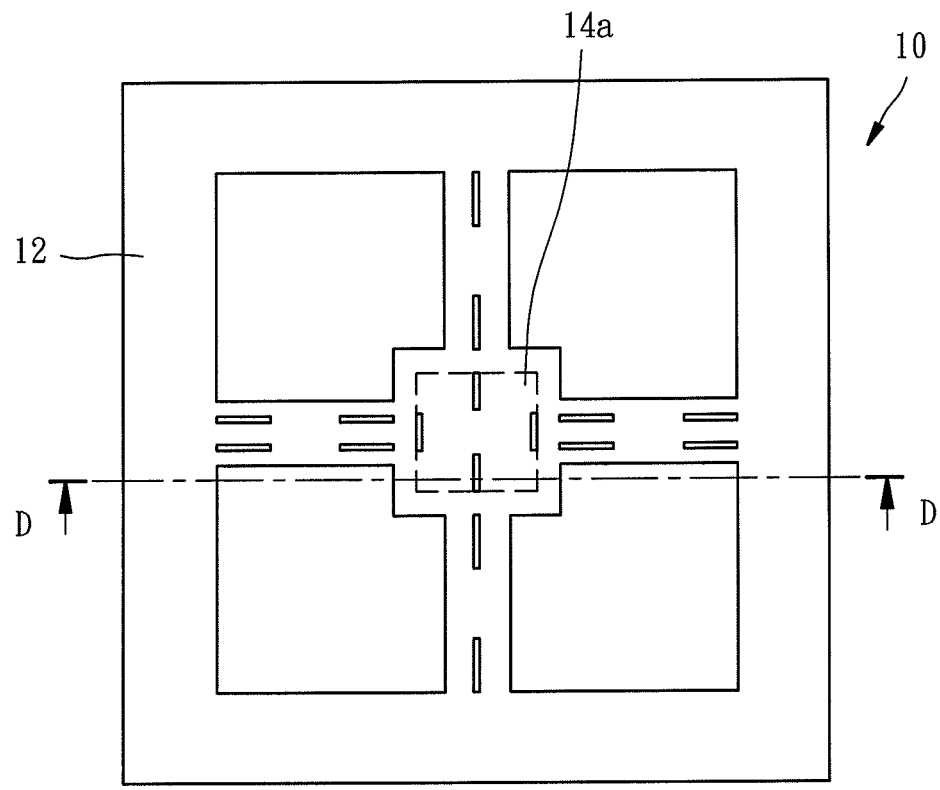
FIG. 9A is a schematic top view showing that four openings are formed through the first wafer.
Figure 9B:
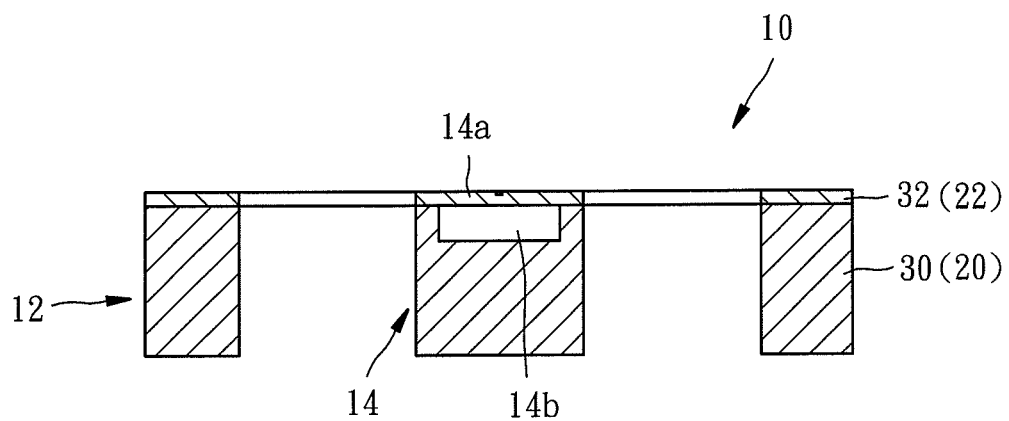
FIG. 9B is a sectional view taken along line D-D of FIG. 9A.

Following the step of forming the openings 32a, a backside etching is carried out to remove the portions of the first wafer 30 that correspond in location and shape to the openings 32a so as to obtain the resistive-type MEMS sensor 10 of the first preferred embodiment of the present invention, which is capable of measuring acceleration and pressure. As shown in FIGS. 9A and 9B, the first wafer 30 becomes eventually the bottom layer 20 of the MEMS sensor 10 and the second wafer 32 becomes the top layer 22 of the MEMS sensor 10.

Figure 10:
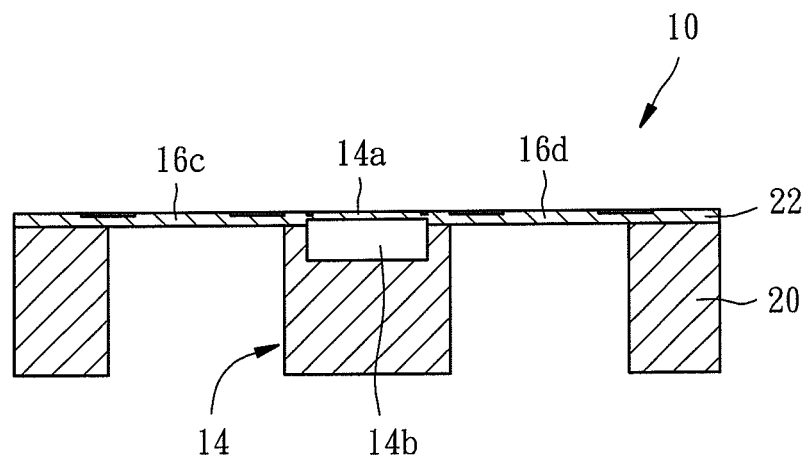
FIG. 10 is a schematic sectional view showing an alternate form of the MEMS sensor, in which the bridges have a thickness greater than that of the pressure sensing diaphragm.
Figure 11:
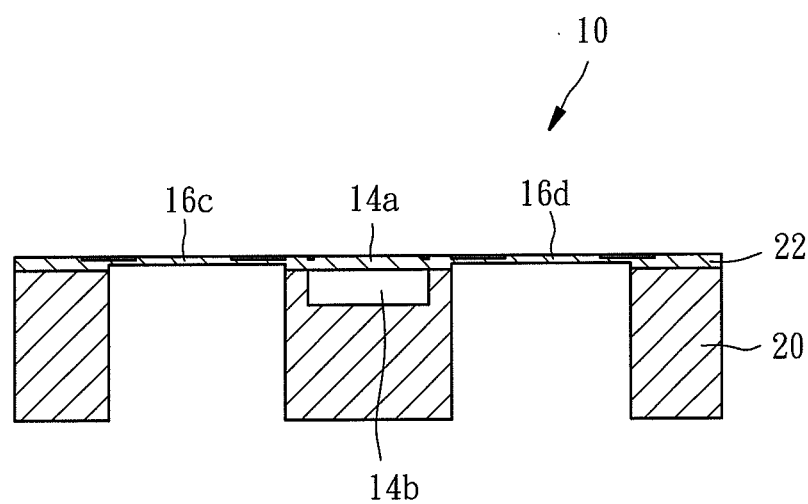
FIG. 11 is a schematic sectional view showing another alternate form of the MEMS sensor, in which the bridges have a thickness smaller than that of the pressure sensing diaphragm.

In the above-mentioned first preferred embodiment, the bridges 16a to 16d have a thickness equal to the thickness of the pressure sensing diaphragm 14a, such that the bridges 16a to 16d and the pressure sensing diaphragm 14a have a same sensitivity of deformation. However, the thicknesses of the bridges and the pressure sensing diaphragm can be designed to be different, such that the bridges can have a sensitivity different from that of the diaphragm subject to the practical need. For example, as shown in FIG. 10, the bottom surface of the center portion of the top layer 22 is provided by etching with a recess in alignment with the recess of the center portion of the bottom layer 20 such that the recesses of the center portions of the top and bottom layers 22 and 20 form the sealed chamber 14b of the proof mass 14 and the bridges 16c and 16d have a thickness greater than that of the diaphragm 14a. Alternatively, FIG. 11 shows an alternate form of the MEMS sensor, in which the thickness of the bridges 16c and 16d is smaller than that of the diaphragm 14a.

Figure 17:
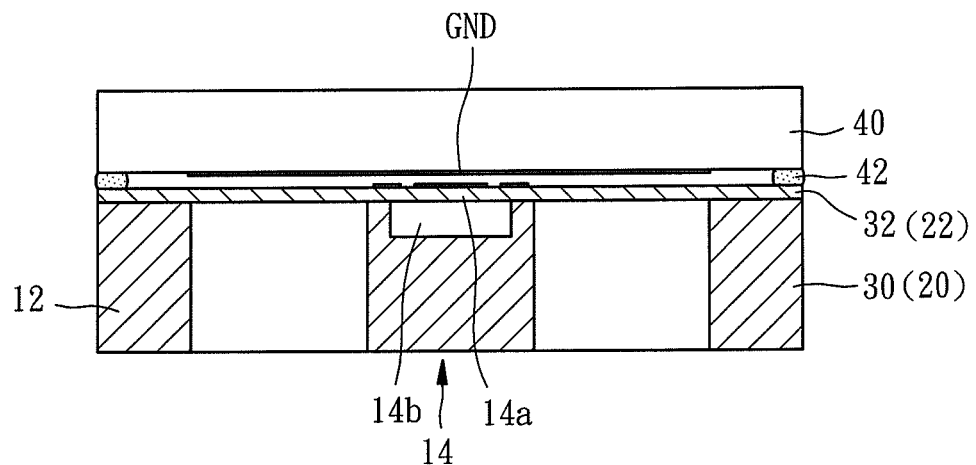
FIG. 17 is similar to FIG. 14B, but showing that the third wafer is bonded on the second wafer.
Figure 18:
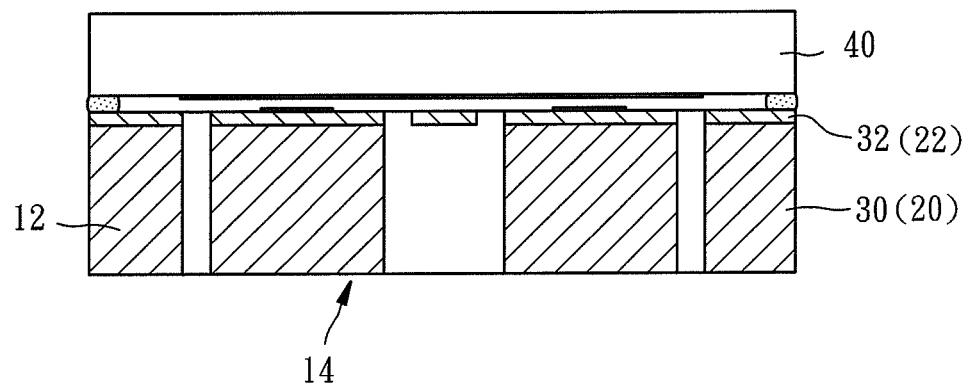
FIG. 18 is similar to FIG. 14C, but showing that the third wafer is bonded on the second wafer.

It is to be understood that the technical feature disclosed in the present invention can not only be applied on the above-mentioned piezo-resistive type accelerometer but also any kind of MEMS sensors having a moveable sensing element, e.g. a capacity type MEMS sensor capable of measuring acceleration and pressure as shown in FIG. 18. The fabrication of the capacity type MEMS sensor in accordance a second preferred embodiment of the present invention will be described hereunder in accompaniment with FIGS. 12-18.

Figure 12A:
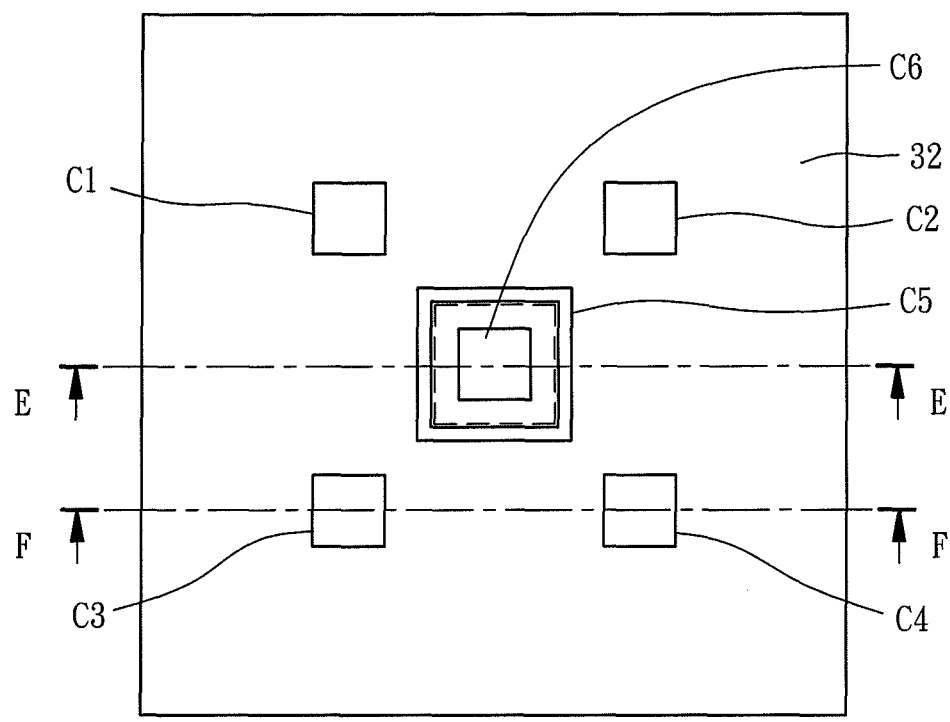
FIG. 12A is a schematic top view showing a manufacturing step of a MEMS sensor according to a second preferred embodiment of the present invention, in which capacity electrodes for measuring acceleration and pressure are formed on the top surface of the thinned second wafer.
Figure 12B:
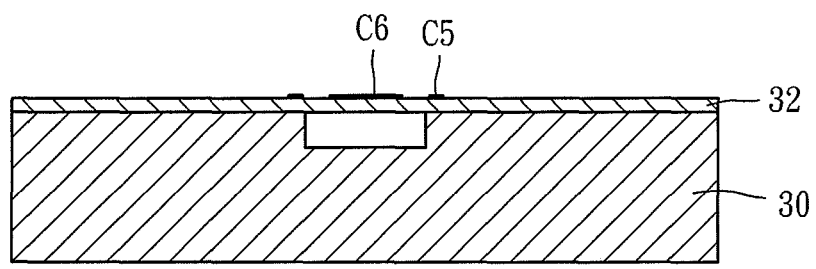
FIG. 12B is a sectional view taken along line E-E of FIG. 12A.
Figure 12C:
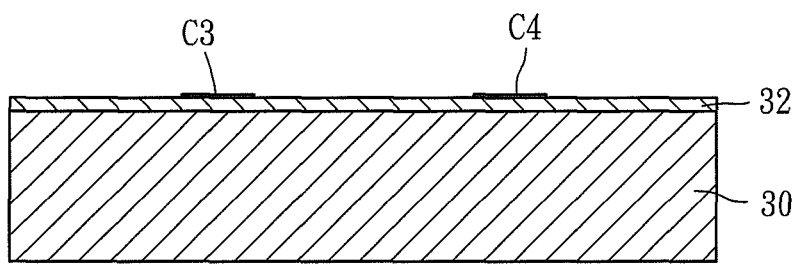
FIG. 12C is a sectional view taken along line F-F of FIG. 12A.

After the recess is formed on the first wafer 30 and the second wafer 32 is bonded on the first wafer 30 and thinned to a predetermined extent, a sputtering process is carried out to form aluminum capacity electrodes $C_1$ to $C_6$ for measuring acceleration and pressure on the predetermined locations of the top surface of the second wafer 32, as shown in FIGS. 12A to 12C.

Figure 13A:
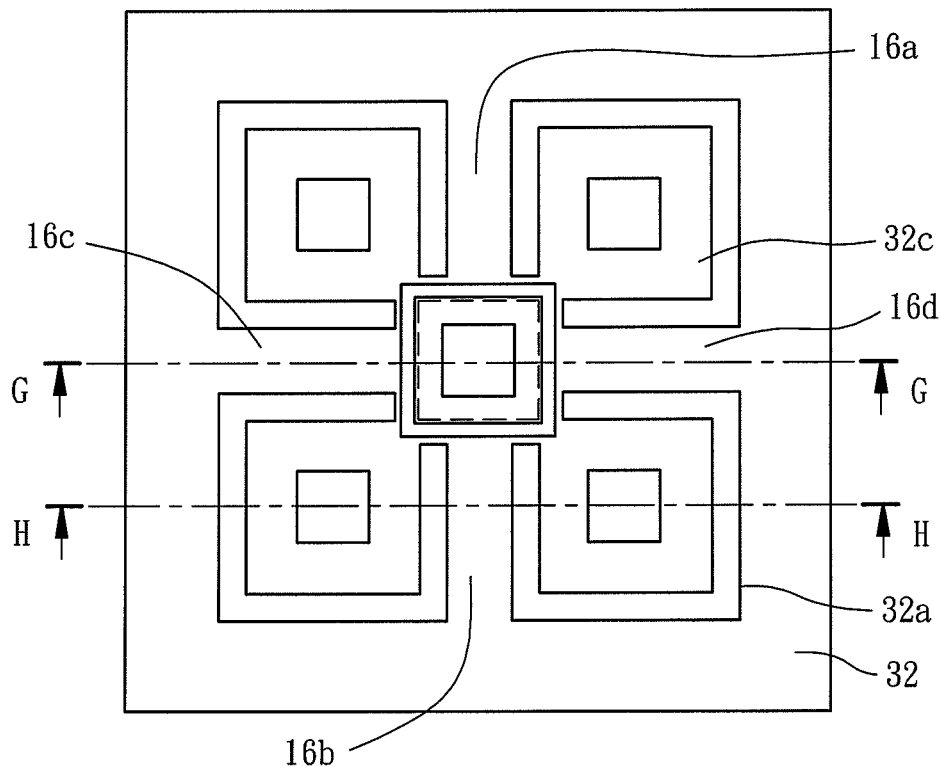
FIG. 13A is a schematic top view showing that four openings are formed around a center portion of the second wafer.
Figure 13B:
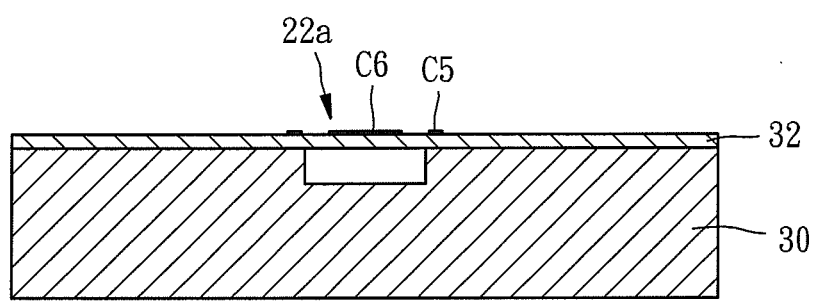
FIG. 13B is a sectional view taken along line G-G of FIG. 13A.
Figure 13C:
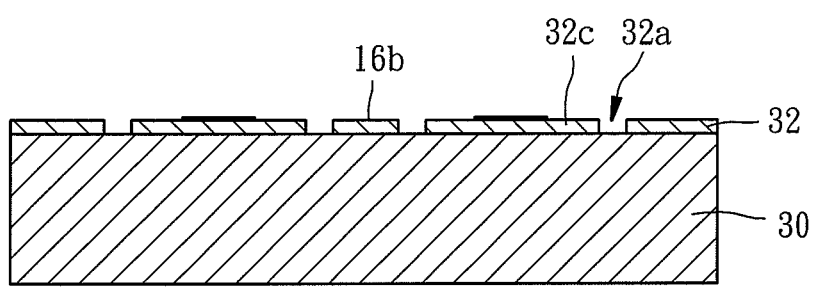
FIG. 13C is a sectional view taken along line H-H of FIG. 13A.

The next step in the process is to form four openings 32a on the second wafer 32 by etching. As shown in FIGS. 13A to 13C. these openings 32a are equiangularly spaced around the center portion of the second wafer 32, penetrate through the top and bottom surfaces of the second wafer 32 and have a predetermined configuration in such a way that four bridges 16a to 16d, a rectangular center portion 22a integrally connected with the bridges 16a to 16d, and an ambient portion 32c containing four areas surrounded respectively by the four openings 32a are formed on the second wafer 32. It can be seen from the drawings that one capacity electrode is deposited on each of the areas of the ambient portion. The four areas of the ambient portion 32c of the second wafer 32 are integrally connected with and equiangularly spaced around the center portion 22a of the second wafer 32.

Figure 14A:
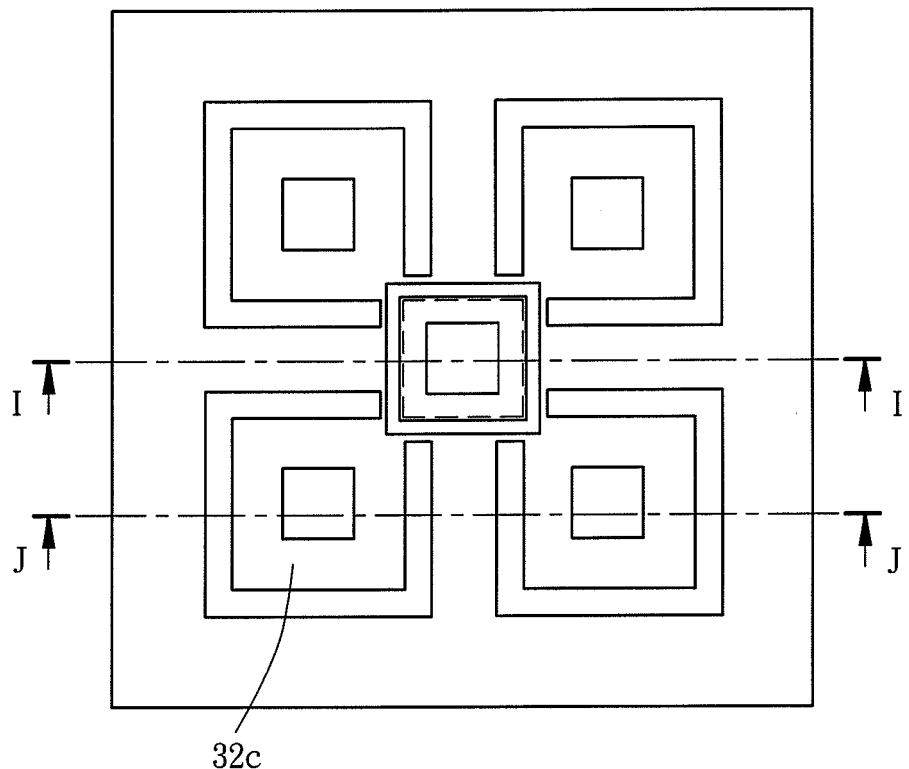
FIG. 14A is a schematic top view showing that four openings are formed through the first wafer.
Figure 14B:
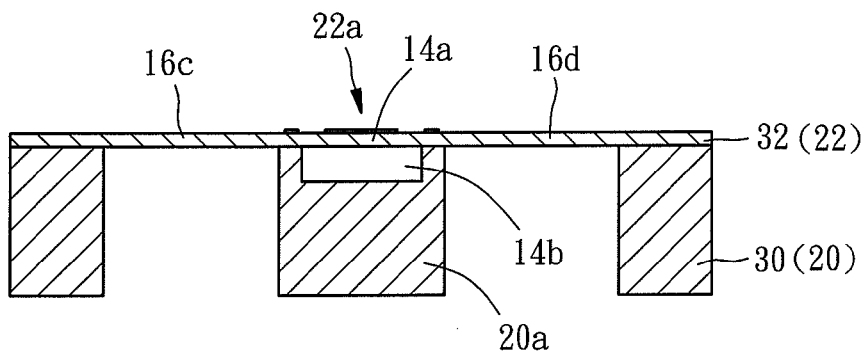
FIG. 14B is a sectional view taken along line I-I of FIG. 14A.
Figure 14C:
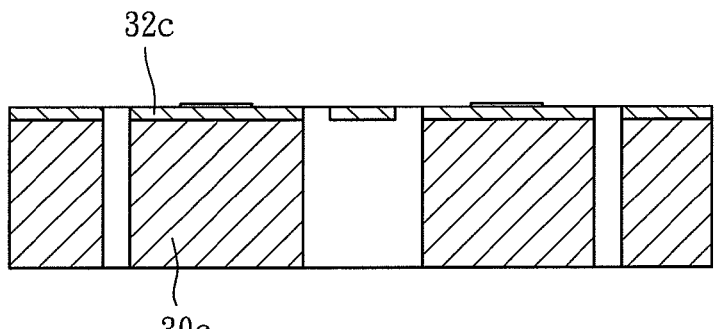
FIG. 14C is a sectional view taken along line J-J of FIG. 14A.

Following the step of forming the openings 32a, a backside etching is carried out to remove the portions of the first wafer 30 that correspond in location and shape to the openings 32a of the second wafer 32 so as to obtain a main structure of capacity-type MEMS sensor of the second preferred embodiment of the present invention, which is capable of measuring acceleration and pressure. As shown in FIGS. 14A to 14C, the first wafer 30 becomes eventually the bottom layer 20 of the MEMS sensor and the second wafer 32 becomes the top layer 22 of the MEMS sensor. In addition, the bottom layer 20 has a center portion 20a corresponding to the center portion 22a of the top layer 22, and an ambient portion 30c corresponding to the ambient portion 32c of the top layer 22 such that the center portions 20a and 22a and the ambient portions 30c and 32c of the bottom and top layers 20 and 22 form the proof mass and the sealed chamber 14b is formed in between the diaphragm 14a of the center portion 22a of the top layer 22 and the center portion 20a of the bottom layer 20.

Figure 15:
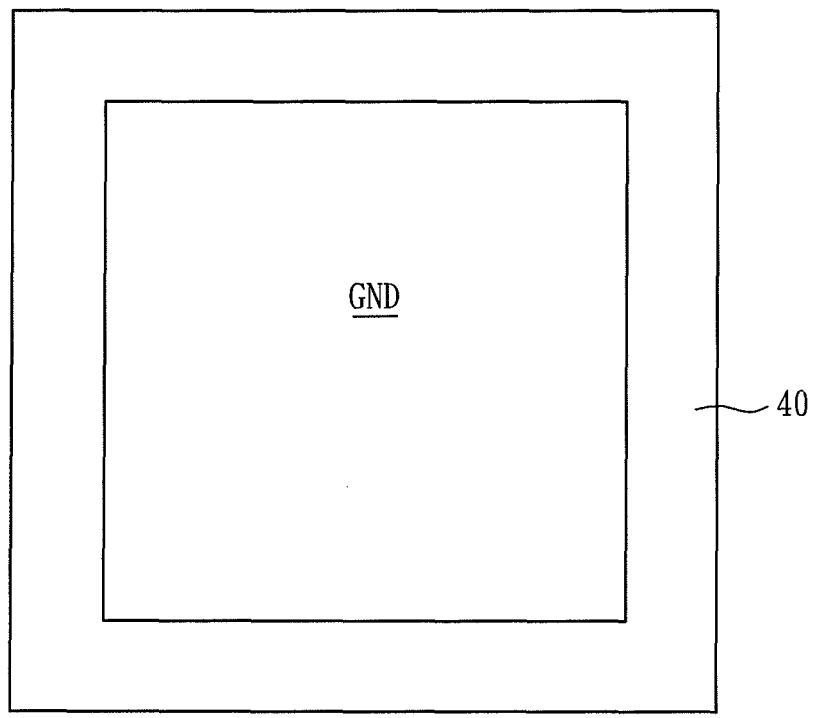
FIG. 15 is a schematic bottom view showing that a ground electrode is formed on the bottom surface of a third wafer.
Figure 16:
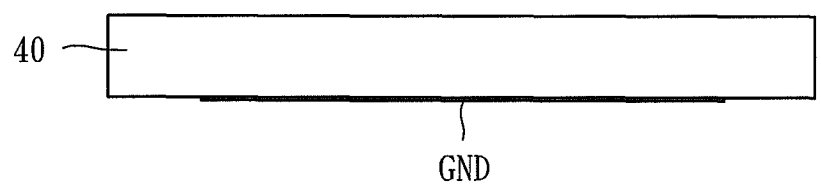
FIG. 16 is a lateral view of the third wafer shown in FIG. 15.

FIGS. 15 and 16 show a third wafer 40, on the bottom surface of which is provided with a ground electrode GND by sputtering, chemical vapor deposition or other suitable technology. As shown in FIGS. 17 and 18, the third wafer 40 is bonded on the top surface of the second wafer 32 by adhesive 42 such that the third wafer 40 can be served as a protective cap connected on the top layer 22 of the MEMS sensor. The third wafer 40 is bonded on the second wafer 32 in such a way that the ground electrode GND spacedly faces the capacity electrodes $C_1$ to $C_6$ so as to form six capacities therebetween. By means of the combinations of the six capacities, a pressure measuring capacity set and three capacity sets for measuring X-, Y- and Z-axis accelerations can be formed. It will be appreciated that the positions where the capacity electrodes are formed are not limited to the design disclosed in this preferred embodiment. Any suitable layout of the capacity electrodes that can achieve the acceleration and pressure measurement can be used in cooperation with the technical feature of the present invention.

In conclusion, the MEMS sensor of the present invention is characterized in that the sealed chamber and the pressure sensing diaphragm for measuring pressure are integrated into the proof mass for measuring acceleration such that the MEMS sensor provided by the present invention is capable of measuring acceleration and pressure simultaneously. Compared to the prior art that needs two separated sensors for measuring acceleration and pressure respectively, the MEMS sensor of the present invention has the advantages of low cost and small size.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A MEMS sensor, comprising:
   a frame;
   a plurality of flexible bridges extending from the frame;
   a proof mass connected with the flexible bridges such that the proof mass is suspended inside the frame, the proof mass having a pressure sensing diaphragm and a sealed chamber beneath the pressure sensing diaphragm; and
   a bottom layer and a top layer bonded on the bottom layer; wherein the top layer comprises said flexible bridges and a center portion that is connected with said flexible bridges and provided with said pressure sensing diaphragm; the bottom layer comprises a center portion corresponding to the center portion of the top layer such that the center portions of the top and bottom layers form said proof mass and said sealed chamber is formed between the pressure sensing diaphragm of the center portion of the top layer and the center portion of the bottom layer.

2. The MEMS sensor as claimed in claim 1, wherein a plurality of resistances for measuring acceleration are arranged on the flexible bridges and a plurality of resistances for measuring pressure are arranged on the pressure sensing diaphragm.

3. The MEMS sensor as claimed in claim 2, wherein the flexible bridges comprises a first pair of bridges linearly arranged on two opposite sides of the center portion of the top layer, and a second pair of bridges linearly arranged on another two opposite sides of the center portion of the top layer and extending along a direction that is orthogonal to a direction along which the first pair of bridges extend.

4. The MEMS sensor as claimed in claim 3, wherein the resistances for measuring acceleration comprises a first set of four resistances arranged on the first pair of bridges, and a second set of four resistances and a third set of four resistances arranged on the second pair of bridges; the resistances for measuring pressure comprise a set of four resistances arranged on the pressure sensing diaphragm.

5. The MEMS sensor as claimed in claim 1, wherein the flexible bridges have a thickness smaller than that of the pressure sensing diaphragm.

6. The MEMS sensor as claimed in claim 5, wherein the flexible bridges comprises a first pair of bridges linearly arranged on two opposite sides of the proof mass, and a second pair of bridges linearly arranged on another two opposite sides of the proof mass and extending along a direction that is orthogonal to a direction along which the first pair of bridges extend.

7. The MEMS sensor as claimed in claim 1, wherein the flexible bridges have a thickness greater than that of the pressure sensing diaphragm.

8. The MEMS sensor as claimed in claim 7, wherein the flexible bridges comprises a first pair of bridges linearly arranged on two opposite sides of the proof mass, and a second pair of bridges linearly arranged on another two opposite sides of the proof mass and extending along a direction that is orthogonal to a direction along which the first pair of bridges extend.

9. A MEMS sensor, comprising:
   a frame;
   a plurality of flexible bridges extending from the frame;
   a proof mass connected with the flexible bridges such that the proof mass is suspended inside the frame, the proof mass having a pressure sensing diaphragm and a sealed chamber beneath the pressure sensing diaphragm; and
   a bottom layer and a top layer bonded on the bottom layer; wherein the top layer comprises said flexible bridges, a center portion that is connected with said flexible bridges and provided with said pressure sensing diaphragm, and an ambient portion connected around the center portion; the bottom layer comprises a center portion corresponding to the center portion of the top layer and an ambient portion corresponding to the ambient portion of the top layer such that the center portions and the ambient portions of the top and bottom layers form said proof mass and said sealed chamber is formed between the pressure sensing diaphragm of the center portion of the top layer and the center portion of the bottom layer.

10. The MEMS sensor as claimed in claim 9, wherein a plurality of capacity electrodes for measuring acceleration are arranged on the center and ambient portions of the top layer and a capacity electrode for measuring pressure is arranged on the pressure sensing diaphragm.

11. The MEMS sensor as claimed in claim 10, further comprising a cap bonded on the top layer and provided with a ground electrode facing the capacity electrodes for measuring acceleration and pressure.

12. The MEMS sensor as claimed in claim 11, wherein the flexible bridges comprises a first pair of bridges linearly arranged on two opposite sides of the center portion of the top layer, and a second pair of bridges linearly arranged on another two opposite sides of the center portion of the top layer and extending along a direction that is orthogonal to a direction along which the first pair of bridges extend.

13. The MEMS sensor as claimed in claim 9, wherein the flexible bridges have a thickness smaller than that of the pressure sensing diaphragm.

14. The MEMS sensor as claimed in claim 9, wherein the flexible bridges have a thickness greater than that of the pressure sensing diaphragm.

\* \* \* \* \*